US010382871B2

(12) United States Patent
Moller et al.

(10) Patent No.: US 10,382,871 B2
(45) Date of Patent: Aug. 13, 2019

(54) MINIATURE HEARING INSTRUMENT CONFIGURED FOR POSITIONING AT LEAST PARTIALLY IN BONY REGION OF EAR CANAL

(71) Applicant: OTICON A/S, Smorum (DK)

(72) Inventors: Kenneth Rueskov Moller, Smorum (DK); Jan T. L. Larsen, Smorum (DK)

(73) Assignee: Oticon A/S, Smørum (DK)

( * ) Notice: Subject to any disclaimer, the term of this patent is extended or adjusted under 35 U.S.C. 154(b) by 0 days.

(21) Appl. No.: 15/824,043

(22) Filed: Nov. 28, 2017

(65) Prior Publication Data
US 2018/0084353 A1 Mar. 22, 2018

Related U.S. Application Data

(60) Continuation of application No. 15/092,016, filed on Apr. 6, 2016, now Pat. No. 9,866,977, which is a
(Continued)

(30) Foreign Application Priority Data

Jun. 7, 2010 (EP) ..................................... 10165072

(51) Int. Cl.
H04R 25/00 (2006.01)
H05K 1/18 (2006.01)
(52) U.S. Cl.
CPC ............. H04R 25/60 (2013.01); H04R 25/65 (2013.01); H04R 25/658 (2013.01);
(Continued)
(58) Field of Classification Search
CPC ...... H04R 25/60; H04R 25/65; H04R 25/658; H04R 2225/023; H04R 2225/025;
(Continued)

(56) References Cited

U.S. PATENT DOCUMENTS 4,495,546 A * 1/1985 Nakamura .......... H01L 23/5387
257/E23.177
4,639,556 A * 1/1987 Hartl ...................... H04R 25/60
381/324
(Continued)

FOREIGN PATENT DOCUMENTS

DE 8426609.0 U1 12/1985
DE 4319599 C1 8/1994
(Continued)

OTHER PUBLICATIONS

Extended European Search Report, dated Jan. 24, 2011, for European Application No. 10165072.9.

Primary Examiner — Phylesha Dabney
(74) Attorney, Agent, or Firm — Birch, Stewart, Kolasch & Birch, LLP

(57) ABSTRACT

The application relates to a portable electronic device comprising a) a folded substrate carrying components of the device, and b) another, separate component having a fixed outer contour, and c) a housing for enclosing said folded substrate and said separate component, said housing having an inner contour, wherein said folded substrate is folded from a planar substrate along a folding line, said folded substrate exhibiting outer edges comprising a folded edge following said folding line. The application further relates to a method of manufacturing a folded substrate. The object of the present application is to facilitate miniaturization of a portable electronic device, such as a hearing aid. The problem is solved in that the folded substrate is shaped to provide that at least one of said outer edges follow(s) the fixed outer contour of the separate component and/or the inner contour of said housing. This has the advantage of providing a larger area on the substrate to place components and soldering points thereby improving the use of the available space in the portable electronic device. The invention may e.g. be used in electronic devices where volume utilization is an important design parameter, e.g. hearing aids comprising a
(Continued)

part adapted for being mounted in an ear canal of a user, e.g. in the bony part of the ear canal.

13 Claims, 6 Drawing Sheets

Related U.S. Application Data division of application No. 13/154,676, filed on Jun. 7, 2011, now Pat. No. 9,338,569.

(60) Provisional application No. 61/351,949, filed on Jun. 7, 2010.

(52) U.S. Cl.
CPC .. *H04R 2225/023* (2013.01); *H04R 2225/025* (2013.01); *H05K 1/189* (2013.01); *Y10T 29/4913* (2015.01)

(58) Field of Classification Search
CPC ............... H04R 25/604; H04R 25/602; H04R 2225/021; H04R 5/608; H04R 25/656; H04R 25/48; H04R 11/02; H04R 2460/11; H04R 25/02; H04R 25/502; H04R 25/652; Y10T 29/4913; H05K 1/189; H05K 1/182; H05K 2201/042; H05K 2201/10037; H05K 2201/10083; H05K 2201/2009; H05K 3/0058; H05K 3/4691; H01M 2/1055; H04M 1/029; A61N 1/36128; B60T 11/16; E05B 45/005; E05B 67/003; E05B 73/0029; F16B 21/18
USPC ........................................................ 381/324
See application file for complete search history.

(56) References Cited

U.S. PATENT DOCUMENTS

| | | | | |
|---|---|---|---|---|
| 4,890,329 A * | 12/1989 | Erbe | ...................... | H04R 25/60 381/322 |
| 5,825,896 A * | 10/1998 | Leedom | ................. | H04R 25/60 381/322 |
| 6,137,889 A * | 10/2000 | Shennib | ............... | H04R 25/456 181/130 |
| 6,208,741 B1 * | 3/2001 | Shennib | ............... | H04R 25/602 181/130 |
| 6,456,720 B1 * | 9/2002 | Brimhall | ................ | H04R 25/60 381/322 |
| 6,532,295 B1 * | 3/2003 | Brimhall | .............. | H04R 25/608 181/130 |
| 6,751,327 B1 * | 6/2004 | Urso | ................... | H01M 2/0202 181/130 |
| 8,340,335 B1 * | 12/2012 | Shennib | ................. | H04R 25/60 381/315 |
| 2001/0038703 A1 * | 11/2001 | Paczkowski | ........... | H05K 1/189 381/324 |
| 2004/0247149 A1 * | 12/2004 | Sorensen | ............. | H04R 25/602 381/328 |
| 2007/0036379 A1 | 2/2007 | Anderson et al. | | |
| 2008/0137891 A1 * | 6/2008 | Vohringer | ............ | H04R 25/602 381/328 |
| 2009/0074220 A1 | 3/2009 | Shennib | | |
| 2009/0136068 A1 * | 5/2009 | Koo | ..................... | H05K 1/0218 381/322 |
| 2011/0233783 A1 * | 9/2011 | Lim | .................... | H01L 23/5387 257/762 |
| 2013/0129128 A1 * | 5/2013 | Wagner | ................ | H04R 25/602 381/323 |
| 2016/0050474 A1 * | 2/2016 | Rye | ......................... | H05K 7/08 381/152 |
| 2016/0057546 A1 * | 2/2016 | Lyon | ........................ | H04R 25/00 381/312 |

FOREIGN PATENT DOCUMENTS

| | | |
|---|---|---|
| EP | 0500988 B1 | 2/1995 |
| EP | 2063666 A2 | 5/2009 |
| WO | WO 00/25551 A1 | 5/2000 |
| WO | WO 03/032682 A1 | 4/2003 |
| WO | WO 2006/121334 A1 | 11/2006 |

* cited by examiner

MINIATURE HEARING INSTRUMENT CONFIGURED FOR POSITIONING AT LEAST PARTIALLY IN BONY REGION OF EAR CANAL

This application is a Continuation of copending application Ser. No. 15/092,016, filed on Apr. 6, 2016, which is a Divisional of copending application Ser. No. 13/154,676, filed on Jun. 7, 2011, now U.S. Pat. No. 9,338,569, issued on May 10, 2016, which claims priority under 35 U.S.C. § 119(e) to U.S. Provisional Application No. 61/351,949, filed on Jun. 7, 2010, and under 35 U.S.C. § 119(a) to Application No. EP 10165072.9, filed in Europe on Jun. 7, 2010, all of which are hereby expressly incorporated by reference into the present application.

TECHNICAL FIELD

The present application relates to portable electronic devices, e.g. hearing aids, e.g. such hearing aids that are adapted to be located in the ear canal of a user. The disclosure relates specifically to a portable electronic device comprising a) a folded substrate carrying components of the device, and b) another, separate component having a fixed outer contour, and c) a housing for enclosing said folded substrate and said separate component, said housing having an inner contour, wherein said folded substrate is folded from a planar substrate along a folding line, said folded substrate exhibiting outer edges comprising a folded edge following said folding line.

The application furthermore relates to a method of manufacturing a folded substrate for a portable electronic device.

The disclosure may e.g. be useful in applications such as electronic devices where volume utilization is an important design parameter, e.g. hearing aids comprising a part adapted for being mounted in an ear canal of a user, e.g. in the bony part of the ear canal.

BACKGROUND ART

The following account of the prior art relates to one of the areas of application of the present application, hearing aids.

Space is a scarce resource in a hearing aid. The smaller the hearing aid, the more of the design focus is associated with overcoming volume restraints. An example of a device where such considerations are extremely important is a hearing aid comprising a part adapted for being worn in the bony part of the ear canal (a so-called deep in the ear canal type hearing aid).

US 2008/0137891 A1 describes a deep in the ear hearing aid comprising a microphone, a speaker and an amplifier, as well as a battery connected to an electronics part, wherein the battery accommodation is arranged on the microphone side and comprises a sleeve connected to the electronics part, of which the first end pointing away from the electronics part is open for taking said battery and for providing a sound inlet in the space between said sleeve and the battery fitted therein. The sleeve has an open end and a closed end.

U.S. Pat. No. 6,208,741 describes a battery enclosure for miniature hearing devices that are deeply and entirely positioned within the ear canal of an individual. The battery enclosure is a thin encapsulation that is formed or fitted directly over the battery thus substantially assuming the shape of the encapsulated battery. In an embodiment, the battery enclosure is coated over the battery with protruding contacts forming a battery assembly ready for electrical connection to a miniature canal hearing device.

WO 00/25551 A1 describes a hearing aid with a housing formed with an exterior peripheral layer of a deformable material. Electronic components located within the deformable layer can be encapsulated, at least in part, with a second deformable material. The second material also fills voids in the interior of the deformable peripheral layer.

U.S. Pat. No. 6,751,327 describes a battery assembly comprising an elongated plastic shell irregularly shaped to fit optimally in anatomical cavities, particularly ear canals. The battery assembly relies structurally on a thin plastic shell which is designed to be inexpensively formed in a variety of complex shapes, thus offering superior volumetric utilization and energy capacity when compared with conventional metal button cell designs.

DISCLOSURE OF INVENTION

An aspect of the idea is to shape a flexible substrate carrying at least some of the electronic components of the portable electronic device to fit the battery form (and/or to the form of another relatively large component located external to the substrate and/or to the inner contour or shape of the housing) in a three dimensional structure.

An object of the present application is to facilitate miniaturization of a portable electronic device, such as a hearing aid.

Objects of the application are achieved by the invention described in the accompanying claims and as described in the following.

A Portable Electronic Device:

An object of the application is achieved by a portable electronic device comprising a) a folded substrate carrying components of the device, and b) another, separate component having a fixed outer contour, and c) a housing for enclosing said folded substrate and said separate component, said housing having an inner contour, wherein said folded substrate is folded from a planar substrate along a folding line, said folded substrate exhibiting outer edges comprising a folded edge following said folding line. The portable electronic device is characterized in that the folded substrate has a shape to provide that at least one of said outer edges follow(s) the fixed outer contour of the separate component and possibly the inner contour of said housing.

This has the advantage of providing a larger area on the substrate to place components and soldering points thereby improving the use of the available space in the portable electronic device.

A portable electronic device is in the present context taken to mean an electronic device (which at least during operation is) adapted for being worn by a person, e.g. at or in an ear, around an arm, around the neck, in a pocket or attached to a piece of clothing, e.g. a belt. Typically, a portable electronic device comprises a local energy source (e.g. a (possibly rechargeable) battery) for energizing the electronic components of the device. In an embodiment, the portable electronic device comprises an electric interface (e.g. a wired or wireless) to another device or a network. In an embodiment, portable electronic device is a relatively small device, e.g. having maximum outer dimensions smaller than 0.1 m, such as smaller than 0.05 m, such as smaller than 0.02 m, such as smaller than 0.01 m.

In an embodiment, the portable electronic device comprises a CIC-part (CIC=Completely In the ear Canal) adapted for being mounted in the ear canal of the user wherein the CIC part comprises said housing and said folded substrate and said separate component. In an embodiment, the CIC-part is adapted for being mounted deep in the ear canal. In an embodiment, the CIC-part is adapted for being mounted fully or partially in the bony part of the ear canal.

In an embodiment, the portable electronic device comprises a signal processing unit for enhancing the input signals (e.g. providing a frequency dependent gain to compensate for a hearing loss of a user) and providing a processed output signal. In an embodiment, the portable electronic device comprises a listening device, such as a hearing instrument (e.g. a deep in the ear canal type hearing instrument adapted for being mounted fully or partially in the bony part of the ear canal), a headset, a headphone or an active ear protection device or a combination thereof.

In an embodiment, the portable electronic device comprises an output transducer for converting an electric signal to a stimulus perceived by the user as an acoustic signal. In an embodiment, the output transducer comprises a number of electrodes of a cochlear implant or a vibrator of a bone conducting hearing device. In a preferred embodiment, the output transducer comprises a receiver (speaker) for providing the stimulus as an acoustic signal to the user.

In an embodiment, the portable electronic device comprises a transceiver unit for receiving (and/or transmitting) a direct electric input. The transceiver unit may be a wireless transceiver unit comprising antenna, transmitter and/or receiver and modulation and/or demodulation circuitry.

In an embodiment, the housing has a fixed inner and outer outline or form (in the meaning that a standard housing is used for a larger number of devices).

In an embodiment, the housing of (or a part thereof) has a variable inner and/or outer outline or form (in the meaning that a non-standard housing is used, e.g. custom made to each product, or made in a number of variants).

The term 'a folded substrate' is in the present context taken to mean a folded planar substrate (i.e. the folded substrate is folded from a formed planar structure along a folding line). The planar substrate has a planar (e.g. layered) structure in that it has outer, substantially co-planar surfaces, the planar structure being characterized in that its (thickness) dimension perpendicular to the co-planar surfaces is much smaller (e.g. at least 2-5 times smaller) than its extension in a direction (such as any direction) of the co-planar surfaces. The folded substrate is typically folded once along a folding line to provide a structure where two parts of one of the co-planar surfaces of the planar substrate end op forming opposing surfaces. Thus, the folded substrate typically exhibits at least one linear edge (namely the edge that follows the folding line, the 'folded edge'). The folded substrate comprises first and second folded parts (said parts being respective parts of the folded substrate 'separated' by a folding line). In an embodiment, the folded substrate comprises at least one (such as two or more) electrical conductor(s) connecting the first and second parts. In an embodiment, a folding zone of the folded substrate extends to each side of the folding line and comprises the part of the folded substrate that is affected by the folding (e.g. in that it forms part of the curved part of the folded substrate to each side of the folding line). In an embodiment, the planar substrate is adapted to provide that the folded substrate comprises at least one (such as two or more) electrical conductor(s) connecting the first and second parts via the folding zone. In an embodiment, the first and second folded parts are of substantially equal form and area to (when folded along the folding line by a folding angle of 180°) provide a folded substrate having a sandwich structure comprising (at least) two opposing parts of the planar substrate of substantially identical form and area. In an embodiment, the formed planar substrate (before folding) comprises $1^{st}$ and $2^{nd}$ parts extending to respective sides of, e.g. symmetrically around, the folding line. This need, however, not be the case, and is basically a system design option. In an embodiment, the first and second (folded) parts are of different form and area.

In an embodiment, the folded substrate comprises more than one fold, e.g. two folds to provide a folded substrate comprising three of more layer parts of the planar substrate (or to provide a folded substrate comprising one or more asymmetric extensions from one or more edges of the substrate parts), the folding of a third part being e.g. in an opposite direction of the folding of first and second parts. Typically the planar substrate is folded along the folding line by a folding angle of 180°. In an embodiment, the folding angle is smaller than 180°, e.g. smaller than 160° to allow room between the folded parts of the planar structure, e.g. for larger components mounted on the planar structure or to allow components external to the substrate to extend in between the folded parts. In an embodiment, the folded substrate comprises two or more folds (e.g. three folds), e.g. to provide a resulting folded substrate having parallel parts with a distance between opposing surfaces of the parallel parts allowing larger components to be mounted on one or both of said opposing surfaces or allowing components external to the substrate to extend in between the folded parts. In an embodiment, a folding angle of a folding line of an extension from an edge of the substrate a substrate part is in the range between 0° and 180°, e.g. in a range including 90°.

In an embodiment, the planar substrate is folded along the (primary) folding line to provide that the folding radius is larger than or equal to a critical folding radius for said planar substrate or for the part of the substrate within a folding zone comprising the folding line. In an embodiment, the folding radius of the folded substrate is larger than or equal to half the distance between opposing surfaces of the folded parts of the substrate (thereby creating a semicircular cross section of the folding zone perpendicular to the planar substrate (of the folded substrate) including a circle section spanning more than 180°, at least one of the folded parts being folded along a auxiliary folding line running parallel to the primary folding line, the fold along the auxiliary folding line(s) being in opposite direction(s) of the fold along the primary folding line). In an embodiment, a folding zone extends in both directions perpendicular to the folding line a distance larger than or equal to the folding radius (when viewed on the un-folded, planar substrate).

In an embodiment, the planar substrate is adapted to have a certain general critical folding radius and a smaller critical folding radius in a folding zone around said folding line. The critical folding radius of a planar substrate is in the present context taken to mean the smallest radius by which the substrate can be folded to provide a folded substrate folded 180° along a folding line without damaging the functional structures (e.g. printed conductors) on the surface of or embedded in the planar substrate.

In an embodiment, the planar substrate has a certain general thickness and a smaller thickness in a folding zone around said folding line to provide a decreased critical folding radius of the substrate in said folding zone compared to a critical folding radius for the substrate in general.

In an embodiment, at least one of the outer edges following the fixed outer contour of the separate component and/or the inner contour of said housing comprises an outer edge other than said folded edge.

In an embodiment, the shaping of the at least one of said outer edges comprise(s) providing an outer form comprising piece-wise linear parts. In an embodiment, the shaping of the at least one of said outer edges comprise(s) providing an outer form comprising non-linear, e.g. elliptical, parts (an edge between two vertices following a non-linear path, e.g. describing a part of a circle or an ellipse or any other, preferably relatively smooth, (non-linear) curve). In an embodiment, the outline of the folded substrate when viewed in a top view (perpendicular to the planar substrate or to one of the folded parts) has a non-rectangular form. In an embodiment, the shaping of the at least one of said outer edges results in the folded substrate to comprise one or more straight line or non-linear edges, e.g. an edge comprising a part of an ellipse. In an embodiment, at least one of the straight line or non-linear edges meet (intersect) another edge in a physical or virtual vertex (a virtual vertex being e.g. formed by extensions of the edges in question, but lying outside the substrate) under an angle different from 90°, e.g. at least 10° different from 90°, e.g. in a range from 20° to 80°.

In an embodiment, the planar substrate is adapted to allow the mounting of components on both sides of the substrate. In an embodiment, the planar substrate is a multi-layer substrate adapted for having more than one layer of electric conductors to provide electrical connection to components on the substrate and/or to components external to the substrate. In an embodiment, the planar substrate comprises intermediate layers adapted for routing metallic conductors to connect to conductors in other intermediate layers and/or to the surface(s) of the substrate.

In an embodiment, the folded substrate comprises one or more distance keeping components adapted for ensuring a minimum distance between opposing surfaces of the folded substrate. In an embodiment, a distance keeping component comprises a locking mechanism for locking two ends of a finalized folded substrate. This has the advantage of easing handling of the folded substrate during manufacturing of the device. In an embodiment, a distance keeping component is located in a part of the substrate where no other components are easily mounted (e.g. in a wedge formed part of the substrate).

In an embodiment, the planar substrate—e.g. a printed circuit board (PCB) (e.g. a flexible PCB)—is adapted to provide that electronic components can be mounted directly onto one or both sides of the planar substrate using a Surface Mount Technology (SMT) (as opposed to mounting technologies e.g. involving pins extending through holes in the planar substrate). Components that are specifically adapted for being surface mounted are typically physically smaller than corresponding components with pins. The use of surface mount components is in general an advantage where relatively small dimensions and a relatively high degree of automation in the mounting process is an advantage. Electronic components adapted for being surface mount are often referred to as SMD (Surface Mount Device) components. An SMD component has electrical terminals in the form of metallised areas (e.g. in the form of end caps) suitable for being soldered (typically by a machine) directly onto solderable electrically conducting pads on the surface of a substrate provided with solder paste for receiving a particular SMD component (the planar substrate, e.g. a PCB, typically having predefined electrically conducting patterns for interconnecting the various SMD components (and possible other electronic components) on the substrate and possibly for connecting the circuitry to external parts).

In an embodiment, the folded substrate comprises one or more extensions adapted for electrically connecting components on the folded substrate to components (e.g. a battery or a microphone unit or a speaker unit) external to the folded substrate. In an embodiment, such extension extends from an edge of one of the parts of the folded substrate other than the folded edge. In an embodiment, a given extension extending from an edge of a first part of the folded substrate is NOT replicated in the other part of the substrate, so that a given extension extending from an edge of a first part of the folded substrate does not have a mirror image (around a plane through the folding line and parallel to a surface of the first part of the folded substrate) extending from an edge of a second part of the folded substrate. In other words the first and second parts of the folded substrate are, in such embodiment, not mirror symmetric around a centrally located, intermediate plane between the two parts in a folded state (nor symmetric around a folding line when viewed in a formed planar (un-folded) state). In an embodiment, the folded substrate comprises one of more symmetric extensions. In an embodiment, the extensions are adapted to establish electrical connection to an external component, e.g. a battery. In an embodiment, extensions of the folded substrate are adapted to press against a housing of an external component, when in a (final) folded state. This provides an easy electric connection of the external component, e.g. a battery, to electrical components of the folded substrate. In an embodiment, the extension(s) comprise electrical connections, e.g. soldering pads (e.g. comprising solder paste) or electrically conducting tape, which are prepared for soldering or otherwise fixing the extensions of the folded substrate to the external component (e.g. to allow reflow soldering or direct gluing of the external component to the extensions of the folded substrate).

A Method of Manufacturing a Folded Substrate:

A method of manufacturing a folded substrate for a portable electronic device described above, in the detailed description of 'mode(s) for carrying out the invention' and in the claims is furthermore provided by the present application. The method comprises a) Deciding an outer form of the folded substrate;
b) Determining a folding line;
c) Providing a planar substrate having a critical folding radius along a folding line;
d) Extracting the outer outline of a planar substrate considering the outer form of the folded substrate, the folding line and a predetermined folding radius larger than or equal to the critical folding radius along the folding line of the substrate;
e) Drafting a layout of components and electrical connections to be included on the planar substrate;
f) Providing a planar substrate comprising a footprint of the electrical connections determined in step e);
g) Mounting the components on the planar substrate;
h) Providing a formed planar substrate having the outer outline extracted in step d);
i) Folding the substrate along the folding line with the predetermined folding radius.

It is intended that the structural features of the portable electronic device described above, in the detailed description of 'mode(s) for carrying out the invention' and in the claims can be combined with the method, when appropriately substituted by a corresponding process and vice versa. Embodiments of the method have the same advantages as the corresponding portable electronic device.

In the system design of the portable electronic device, it is anticipated that the device comprises a folded substrate containing (at least some, e.g. all, of the) electronic components of the device and their interconnections. Step a) of deciding an outer form of the folded substrate can e.g. be based on a system design layout comprising a description of the basic components of the device in question including the external and internal form and size of its housing and a partition of the system into components to be included on a substrate and separate components and their location and interconnections. Such system design can e.g. be made using a computer aided drawing tool, e.g. AutoCAD™ (of Autodesk Inc., USA) or Pro/Engineer® (of Parametric Technology Corporation, USA).

Step b) of determining a folding line can e.g. be decided on from a practical view of the system design layout considering e.g. the location of internal (i.e. on the substrate) and external components and electrical connection points (e.g. solder pads) for external components, ease of manufacture and reliability of the folded substrate. Preferably, the edge of the folded substrate ('the folded edge') containing the folding line is NOT one of the edges that is shaped to follow the fixed outer contour of the separate component and/or the inner contour of the housing, if this contour is non-linear).

Step c) of providing a planar substrate having a critical folding radius along a folding line may in an embodiment, comprise c1) providing a folding zone to the planar substrate extending to each side of the folding line. In an embodiment, step c1) comprises arranging that the planar substrate has a smaller critical folding radius in the folding zone than outside the folding zone. Alternatively, step c1) may be included in step f) of providing a planar substrate comprising a footprint of the electrical connections determined in step e).

Step d) of extracting the outer outline of a planar substrate considering the outer form of the folded substrate, the folding line and a predetermined folding radius larger than or equal to the critical folding radius along the folding line of the substrate can e.g. be made on a trial and error basis, e.g. using physical models (e.g. making a model of the folded substrate using an appropriate folded sheet that can easily be formed to the actual needs, e.g. a sheet of paper or plastic foil and a cutting tool, e.g. a pair of scissors), or alternatively using a computer aided design tool (e.g. e.g. 3D design software SolidWorks Premium® (from Solid Works Corp., USA) or Pro/Engineer® (of Parametric Technology Corporation, USA) with a feature implementing the so-called 'sheet metal method').

Step e) of drafting a layout of components and electrical connections to be included on the planar substrate can e.g. be based on a system design layout comprising a description of the basic components (including the folded substrate) of the device in question as used in step a) and on the outer outline of the planar substrate extracted in step d). A layout of components and electrical connections can e.g. be made using a computer aided design tool (e.g. a dedicated PCB-design tool, such as e.g. PADS® (from Mentor Graphics, USA) or Cadence Allegro® (from Cadence Design Systems, Inc., USA) or a mixed mechanical and electrical design tool, e.g. Pro/Engineer® (of Parametric Technology Corporation, USA))

Step f) of providing a planar substrate comprising a footprint of the electrical connections determined in step e) may comprise any planar processing technology for providing a substrate for mounting and interconnecting electronic components. One example is PCB technology wherein electrical connections (the footprint) are applied to a planar dielectric material in a multistep planar process (e.g. a mask-deposit-etch process as is known from semiconductor technology). The substrate may e.g. be a multilayer substrate (e.g. a flexible substrate, e.g. made of a plastic polymer, e.g. PET (PolyEthylene Terephthalate) or PEN (PolyEthylene Naphthalate) or epoxy glass) and/or both sides of the substrate may be used to mount components and/or route electrical connections. In an embodiment, step f) comprises the creation of a cutting line or cutting profile along the outer outline of the planar substrate as determined in step d) to facilitate the later provision of a formed planar substrate in step h). In an embodiment, the electrical connections comprise wires of a single or of different widths for connecting components on the substrate and/or to connection points to external components (e.g. located on extensions to the folded substrate). In an embodiment, the electrical connections comprise pads for electrically connecting to components external to the planar substrate. In an embodiment, the pads are placed in the layout in parts of the planar substrate that is otherwise difficult to utilize, e.g. due to its irregular form and/or small area, e.g. in parts of the substrate whose edges meet at a mutual angle smaller than 90°, such as smaller than 60°, such as smaller than 45°.

Step g) of mounting the components on the planar substrate may e.g. be performed manually or using an automated process, e.g. using SMD technology.

Step h) of providing a formed planar substrate having the outer outline extracted in step d) (shaping) may in an embodiment comprise sawing or cutting (e.g. using a laser) out the extracted form from a sheet of planar substrate comprising the footprint (e.g. comprising a multitude of identical layouts).

Step i) of folding the substrate along the folding line with the predetermined folding radius may be performed in a manual or an automated process to provide a folded substrate folded along the folding line with a predefined folding angle (e.g. 180°).

The method rents itself conveniently to produce a multitude of formed planar substrates (and from them a multitude of folded substrates) from a single planar 'sheet' substrate. In an embodiment, the method comprises providing a multitude of folded substrates by in step f) providing a planar substrate comprising a multitude of layouts, each having a footprint of the electrical connections determined in step e); and in step g) mounting components for the multitude of layouts on the planar substrate;

in step h) providing a multitude of formed planar substrates each having the form extracted in step d) and comprising the components mounted in step g); and in step i) folding said multitude of individual formed planar substrates along the folding line with the predetermined folding radius.

This has the advantage of providing a multitude of folded substrates (including mounted components) in a batch type (fully or partially automated) process.

Further objects of the application are achieved by the embodiments defined in the dependent claims and in the detailed description of the invention.

As used herein, the singular forms "a," "an," and "the" are intended to include the plural forms as well (i.e. to have the meaning "at least one"), unless expressly stated otherwise. It will be further understood that the terms "includes," "comprises," "including," and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements maybe present, unless expressly stated otherwise. Furthermore, "connected" or "coupled" as used herein may include wirelessly connected or coupled. As used herein, the term "and/or" includes any and all combinations of one or more of the associated listed items. The steps of any method disclosed herein do not have to be performed in the exact order disclosed, unless expressly stated otherwise.

BRIEF DESCRIPTION OF DRAWINGS

The disclosure will be explained more fully below in connection with a preferred embodiment and with reference to the drawings in which.

The figures are schematic and simplified for clarity, and they just show details which are essential to the understanding of the disclosure, while other details are left out.

Further scope of applicability of the present disclosure will become apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from this detailed description.

MODE(S) FOR CARRYING OUT THE INVENTION

Figure 1A:
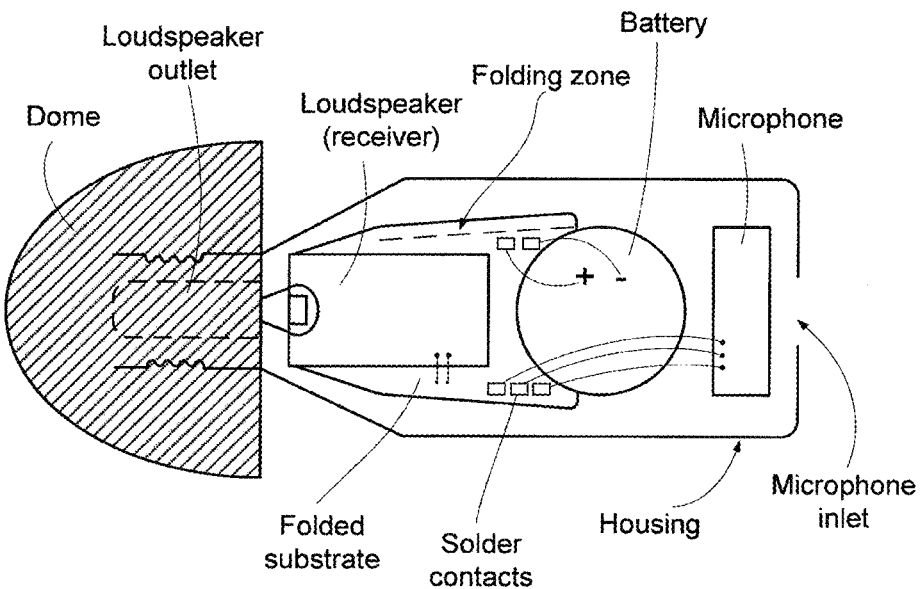
FIGS. 1a-b show cross sections of two embodiments of a completely in the ear canal type hearing aid comprising a battery and a folded substrate for carrying components of the hearing aid.
Figure 1B:
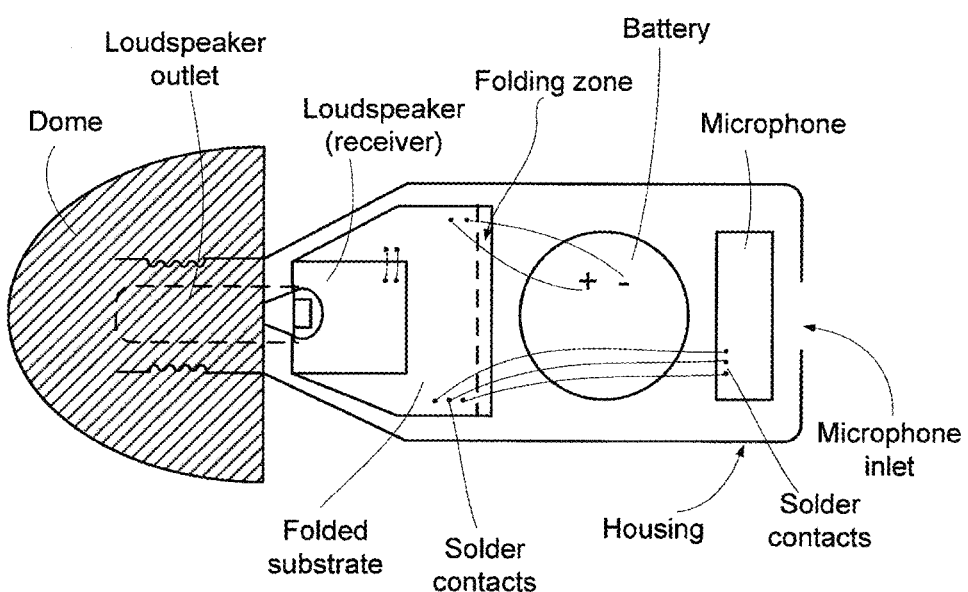
Figure 2A:
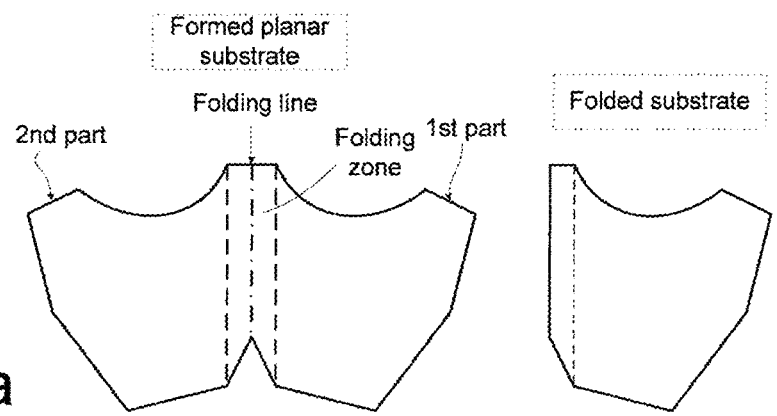
FIGS. 2a-e show various embodiments of a flexible planar substrate and corresponding folded substrate for being used in embodiments of a portable electronic device.
Figure 2B:
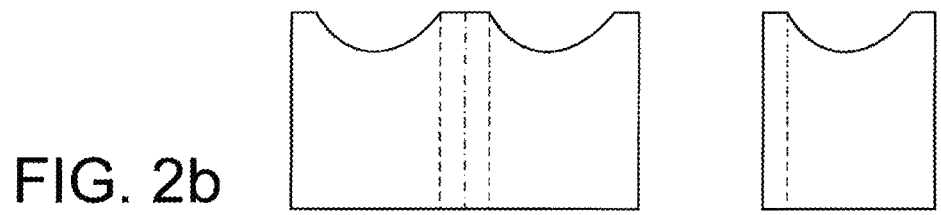
Figure 2C:
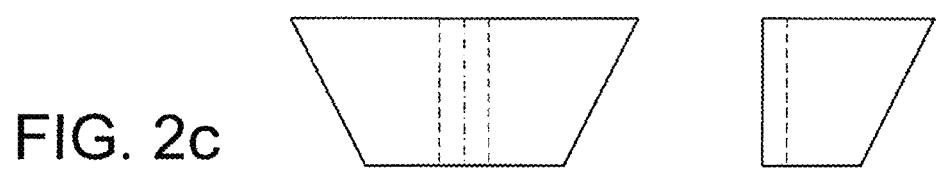
Figure 2D:
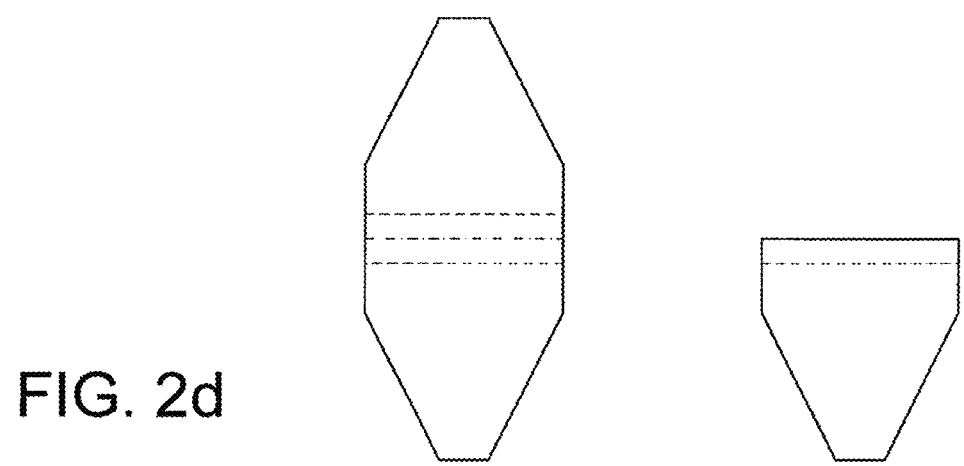
Figure 2E:
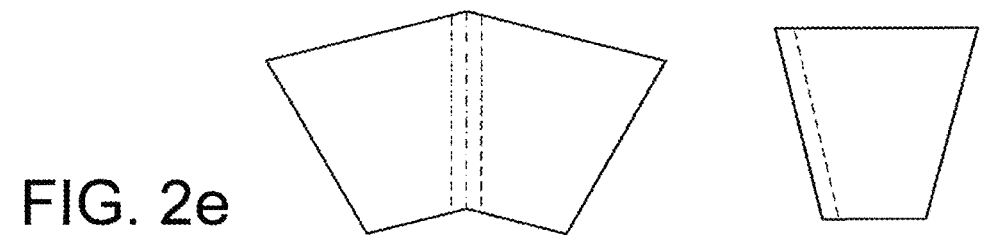

FIGS. 1a-b show cross sections of two embodiments of a completely in the ear canal type hearing aid comprising a battery and a folded substrate for carrying components of the hearing aid. The embodiments of a hearing aid in FIGS. 1a-b comprise a Housing enclosing a Folded substrate comprising a number of interconnected electronic components including a Loudspeaker (receiver) unit for presenting an acoustic output signal to user via a Loudspeaker outlet attached to or forming part of a flexible Dome element for locating the hearing aid in an ear canal of a user. In practice, other components (e.g. discrete or integrated circuit components) in addition to the Loudspeaker (receiver) unit are typically located on the Folded substrate. The Housing further encloses a Battery for energizing the components of the hearing aid enclosed in the Housing and a Microphone unit for picking up a sound from the environment via a Microphone inlet. The Microphone unit, the Battery and the Loudspeaker (receiver) unit are electrically connected to the folded substrate via connecting wires and Solder contacts on the substrate. A Folding zone (a part of the planar substrate mechanically affected by the folding, e.g. by contributing to the curvature) is indicated on the folded substrate. The Folding zone is limited by the dashed line and the nearest outer boundary (the Folding zone typically running on both parts of the planar substrate symmetrically around a folding line represented by the outer outline of the folded substrate next to the dashed line, as e.g. illustrated in FIGS. 5a-b and 6a-b). In the embodiment of FIG. 1a, the outer edges of the Folded substrate are shaped to follow the outer form of the Battery AND the inner form of the Housing, thereby utilizing the available space in the Housing (the Folded substrate having a substantially polygonal form comprising 6 vertices, all but one connected by straight line edges, the last containing a curved shape following the outer form (here a part of a circle) of the Battery, cf. e.g. FIG. 2a). The embodiment shown in FIG. 1b is similar to that of FIG. 1a but differs in that the outer edges of the Folded substrate are ONLY adapted to the inner form of the Housing (the Folded substrate having a polygonal form comprising 6 vertices connected by straight line edges, cf. e.g. FIG. 2d).

FIGS. 2a-e show various embodiments of a foldable planar substrate and corresponding folded substrate for being used in embodiments of a portable electronic device. FIGS. 2a-e show five examples (top to bottom, FIG. 2a-2e) of Formed planar substrates (shown to the left) having an outer outline, which when folded 180° along the Folding line (the central dash-dotted line, surrounded by two symmetrically located dashed lines indicating the Folding zone), lead to the Folded substrate (shown to the right). The Formed planar substrate comprises $1^{st}$ and $2^{nd}$ parts extending to respective sides of (here symmetrically around) the Folding line.

Figure 3A:
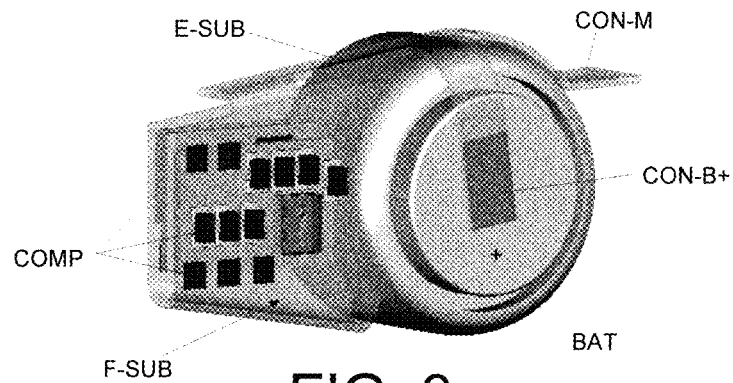
FIGS. 3a-c show an embodiment of a folded substrate shaped to follow the fixed outer contour of a battery, substrate and battery being a part of a portable electronic device, as e.g. illustrated in FIG. 1a (parts Folded substrate and Battery)
Figure 3B:
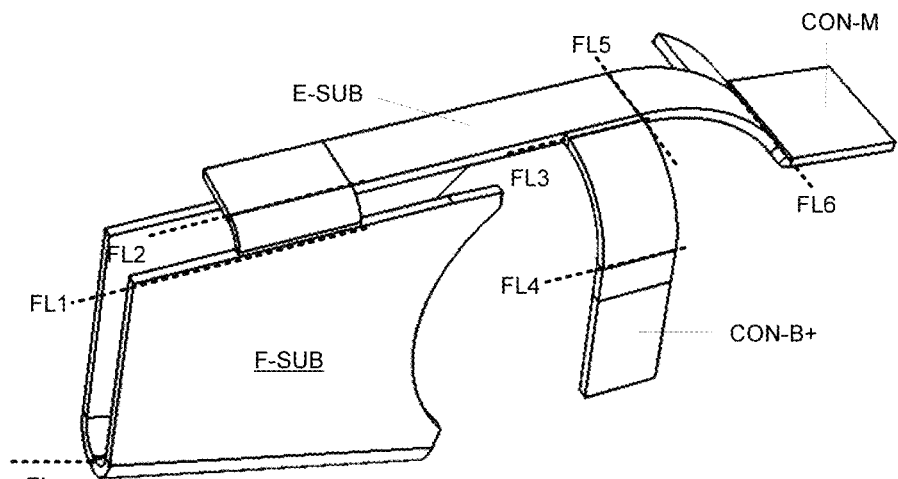
Figure 3C:
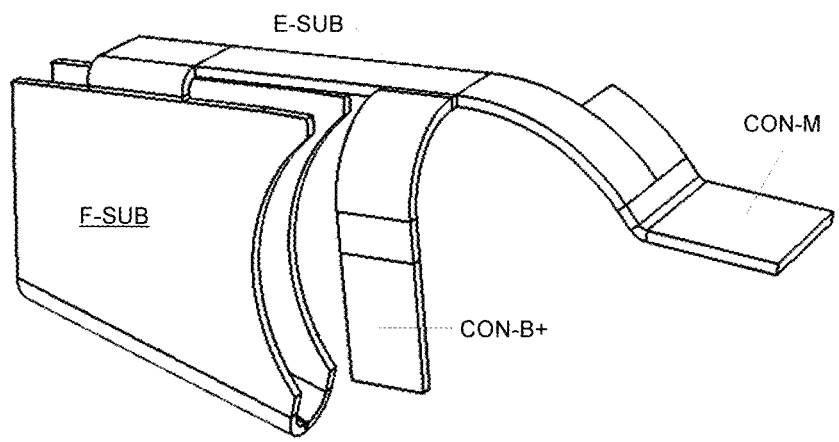

FIGS. 3a-c show an embodiment of a folded substrate shaped to follow the fixed outer contour of a battery, substrate and battery being a part of a portable electronic device, e.g. a device as illustrated in FIG. 1a (compare parts Folded substrate and Battery in FIG. 1a). FIG. 3a is a perspective view of the folded substrate F-SUB, where one of the edges is shaped as a part of a circle to fit the circular form of a battery cell BAT. Various SMD components COMP are mounted on the folded substrate and electrically interconnected by conductors on the surface of the substrate and/or in one or more intermediate layers of the substrate. The folded substrate comprises an extension E-SUB from one of the folded parts of the folded substrate. The extension E-SUB of the substrate comprises electrical conductors (CON-B+, CON-M) for connecting the components on the folded substrate to the (positive terminal+of the) battery BAT and to another component (here a microphone, not shown), respectively. The electrical connections (CON-B+, CON-M) of the extension E-SUB comprise soldering pads or electrically conducting tape allowing (e.g. reflow) soldering or direct gluing of the battery and the microphone, respectively, to the extension E-SUB of the folded substrate F-SUB. Apart from the curved edge of the folded substrate F-SUB (forming part of a circle) facing the battery, the three other edges (one being the folded edge) are linear.

FIGS. 3b and 3c show two different perspective views of the folded substrate F-SUB (without components for clarity) including the extension E-SUB and in particular illustrating the form of the extended substrate. As illustrated by FIGS. 3b and 3c the folded substrate F-SUB including the asymmetric extension of the substrate E-SUB from one of the folded substrate parts can be created from one sheet of a planar substrate by appropriate forming and cutting and subsequent folding along the dashed folding lines (FL of the core folded substrate, and FL1-FL6 of the extension) indicated in FIG. 3b. Alternatively, the extension of the substrate E-SUB can be separately provided and electrically connected (e.g. along folding line FL1) to the (core) folded substrate F-SUB by conventional electrical connection techniques.

Figure 4A:
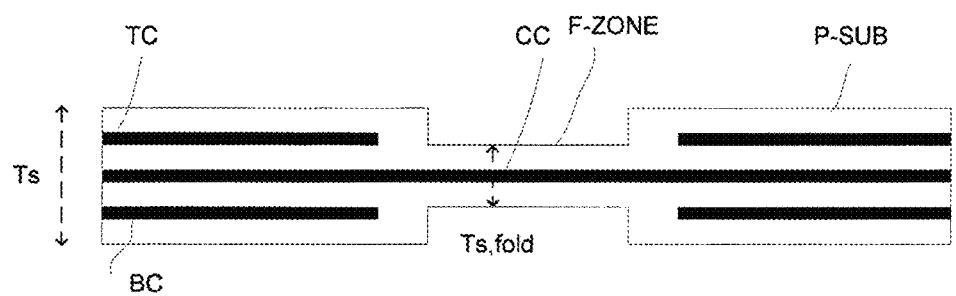
FIGS. 4a-b show exemplary embodiments of a planar substrate comprising a (reduced thickness) folding zone.
Figure 4B:
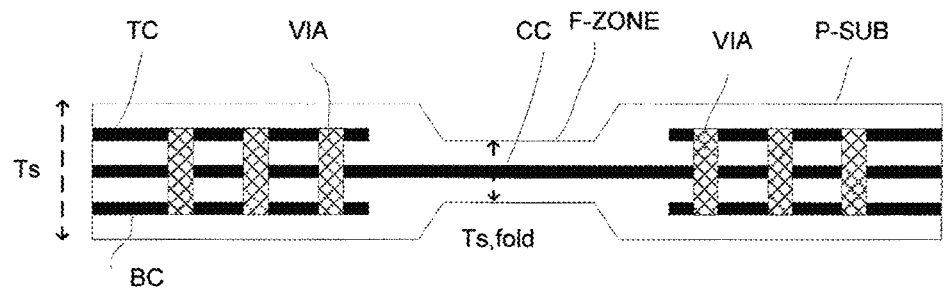

FIGS. 4a-b show exemplary embodiments of a planar substrate comprising a (reduced thickness) folding zone. FIGS. 4a-b show a part of a planar substrate P-SUB around a folding zone F-ZONE, which has been reduced in thickness to a folded zone thickness $T_{s,fold}$ relative to a (possibly average) thickness $T_s$ of the planar substrate outside the folding zone F-ZONE. The planar substrate P-SUB is a multilayer substrate comprising a number of layers (here three intermediate layers are shown) for establishing electrical connections between components on the respective substrate parts (to the left and right sides of the folding zone F-ZONE) and for establishing electrical contact between the two substrate parts (including for creating electrical contact between components located on different substrate parts) via the folding zone F-ZONE. In the embodiment of a planar substrate shown in FIGS. 4a-b, five layers may be used for routing of electrical conductors (two on the opposite surfaces and three intermediate layers), the conducting layers (or rather the layers that may be used for routing of electrical conductors) being separated by electrically insulating layers. However, to decrease the critical folding radius, the substrate has been thinned in the folding zone F-ZONE by only continuing the centrally located, middle metal layer CC over the folding zone (possibly including (as shown here) surrounding insulating layers), whereas the top and bottom intermediate (conductive) layers TC and BC, respectively, are discontinued at the folding zone. The surface layers are preferably not used for routing or contacting in the folding zone F-ZONE. In the embodiment shown in FIG. 4a, the transitions from the folding zone to the rest of the substrate having a 'normal' thickness are abrupt (step-formed), whereas they are made gradual in the embodiment of FIG. 4b. Further, the embodiment of FIG. 4b comprises via holes VIA connecting two or more of the metal layers (here the three intermediate layers are connected) in a zone close to the folding zone to mechanically stabilize the parts of the substrate neighbouring the folding zone F-ZONE. In an embodiment, the substrate comprises a PCB, e.g. a flexible printed circuit board. Such so-called 'flexprints' (comprising customized footprints) are available from a number of vendors, e.g. Mekoprint Electronics NS (of Denmark) or GS Swiss PCB AG (of Switzerland).

Figure 5A:
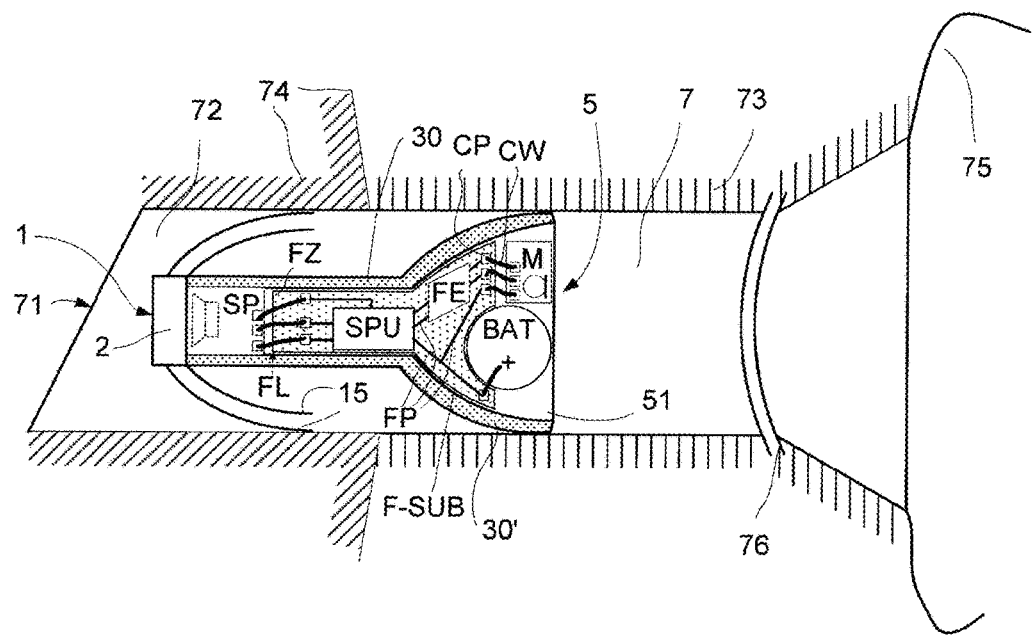
FIGS. 5a-b show an embodiment of a completely in the ear canal type hearing instrument.
Figure 5B:
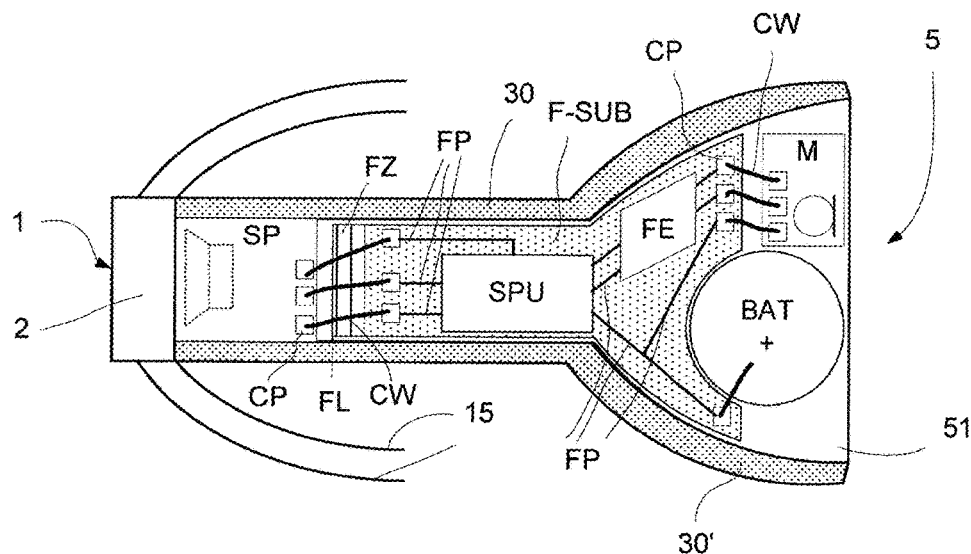

FIGS. 5a-b show an embodiment of a portable electronic device, here in the form of a completely in the ear canal type hearing instrument. FIG. 5a shows a cross-sectional view of the hearing instrument 5 when located fully in an ear canal of a user. The hearing instrument 5 is a self-contained instrument comprising microphone (M), battery (BAT) signal processing unit (SPU) and receiver (speaker, SP) (and possibly other relevant functional parts for providing appropriate amplification (or attenuation) of an input sound and presenting it as a processed output sound to the residual volume 72 close to the ear drum 71 according to a user's needs. The embodiment shown in FIGS. 5a-b is adapted for being located at least partially in the bony part 74 of the ear canal 7. The ear canal 7 can have different lengths (and form) on different people as indicated by the double arcs 76. The outer ear (pinna) is indicated with reference numeral 75. A first part of the hearing instrument 5 having a relatively small cross section is located at least partially in the bony part 74 of the ear canal 7. A second part of the hearing instrument 5 having a relatively large cross section is located at least partially in the softer part 73 of the ear canal 7. The first part comprises a receiver (speaker) unit SP. The second part comprises the more voluminous components, such as e.g. a battery, a signal processing unit, a microphone system, and possible transceiver circuitry (e.g. for establishing a wireless link to another device, e.g. a corresponding hearing instrument at the opposite ear). A front end 1 of the first (slim) part of the hearing instrument comprises a wax filter 2 and an ear canal locating part 15, here a dome part, comprising one or more structural elements for adapting its/their form to the ear canal and thereby controlling the position of the instrument (incl. the receiver) in a cross section of the ear canal. The embodiment of the hearing instrument shown in FIGS. 5a-b comprises two vent channels 30, 30' running along a periphery (in a longitudinal direction) of the housing 51 of the instrument comprising the electronic components (e.g. battery BAT, receiver SP, microphone and folded substrate F-SUB comprising signal processing unit SPU and interconnection circuitry). The folded substrate comprising the (typically mainly digital) signal processing unit SPU and a (typically mixed analogue and digital) front end chip FE is shaped to follow the outer surface of the battery BAT and of an inner surface of the housing 51. The hearing instrument may have any other convenient form, and be located elsewhere in the ear canal (e.g. outside the bony part). Likewise a vent of the hearing instrument may be located elsewhere (e.g. internally) and may be present in other numbers than two (or omitted altogether). The folded substrate F-SUB comprises a folding zone FZ extending around the folding line, where no components are mounted (as indicated by the dotted line in FIG. 5a and the vertically hatched area of the folded substrate in FIG. 5b). The folding line of the substrate is indicated by dashed arrow FL. In FIG. 5b, the listening device shown in FIG. 5a is enlarged to better illustrate the features of the folded substrate as described above. The electrical connections ('footprint' FP) between the components of the folded substrate are schematically indicated in FIGS. 5a-b. Connecting points CP are shown as pads electrically connected to contact points on components external to the folded substrate (here a battery BAT, a speaker SP and a microphone M are shown) by connecting wires CW.

Figure 6A:
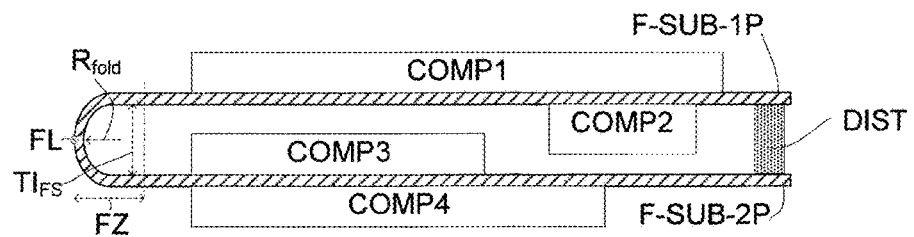
FIGS. 6a-b show two mutually perpendicular views of an embodiment of a folded substrate according to the present disclosure.
Figure 6B:
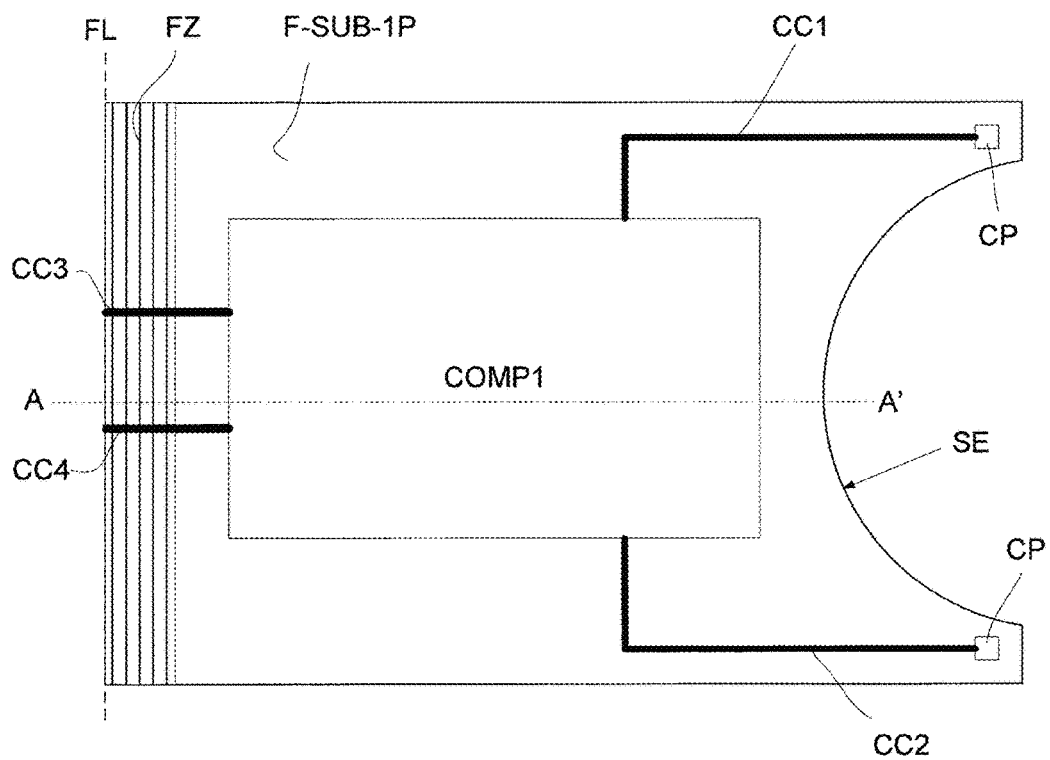

FIGS. 6a-b show two perpendicular views of an embodiment of a folded substrate according to the present disclosure. FIG. 6a shows a cross-sectional side view (taken along line AA' in FIG. 6b) of a 180° folded substrate comprising a first part F-SUB-1P and a second part F-SUB-2P separated by the folding line FL, each part being equipped with electronic components COMP1-COMP4 mounted on both sides of the respective planar substrate parts. A folding zone FZ comprising the curved parts of the first and second substrate parts is (symmetrically) located around the folding line FL. A folding radius $R_{fold}$ adapted to be larger than a critical folding radius of the substrate is indicated (as an 'inner' radius; it may alternatively be taken as the folding radius of a centrally located, median plane of the substrate) together with an (inner) distance $TI_{FS}$ between opposing surfaces of the first and second substrate parts. Here the thickness ($TI_{FS}$) of the folded substrate (without mounted components) is equal to twice the folding radius ($R_{fold}$). The folding zone FZ is, on the other hand, larger than π times the folding radius ($R_{fold}$) (in a direction perpendicular to the folding line FL, when measured in an un-folded view of the planar substrate, the folding line FL running perpendicular to the view of FIG. 6a). The folded substrate further comprises a component DIST adapted for ensuring a minimum distance (TI$_{FS}$) between the opposing surfaces of the folded substrate. In an embodiment, the component DIST comprises a locking mechanism for locking the two ends of the finalized folded substrate, which eases handling during manufacturing of the device. In an embodiment, a number of such components adapted for ensuring a minimum distance between the opposing surfaces of the folded substrate are distributed on the folded substrate, e.g. located in parts of the substrate where no other components are easily mounted (e.g. in a wedge formed part of the substrate). FIG. 6b shows a top view of the first part F-SUB-1P of the folded substrate of FIG. 6a. The upper side of the first part F-SUB-1P of the folded substrate (folded along folding line FL) comprises component COMP1, e.g. a digital signal processor (e.g. SPU of FIGS. 5a-b). The folding zone FZ of the first part F-SUB-1P of the folded substrate is indicated in vertical hatching. The right (non-folded) edge SE of the folded substrate is shaped to fit a circular component, e.g. a battery. Thereby thin, wedge-formed areas of substrate part(s) are created. The component COMP1 is electrically connected (by conductors CC1, CC2) to contact points CP located in the wedge-formed areas (e.g. for making electrical contact to an external component, e.g. a battery), thereby utilizing the available (otherwise un-useable) area better. The component COMP1 is connected to other components on the folded substrate located on the second part F-SUB-2P via connecting conductors CC3, CC4 routed over the folding zone FZ. Conductors CC3, CC4 may run in an intermediate layer of the substrate (e.g. in wiring of a central, conductive layer CC in FIGS. 4a-b) or (as shown here) on the (upper) surface of the substrate. The component COMP1 may be connected to components on the opposite side of the first part of the folded substrate (e.g. COMP2, cf. FIG. 6a) by means of vias in the substrate electrically connecting the two surfaces of the first part of the folded substrate F-SUB-1P. Apart from the shaped edge SE, the other edges of the folded substrate are linear and form a rectangular outline.

The invention is defined by the features of the independent claim(s). Preferred embodiments are defined in the dependent claims. Any reference numerals in the claims are intended to be non-limiting for their scope.

Some preferred embodiments have been shown in the foregoing, but it should be stressed that the invention is not limited to these, but may be embodied in other ways within the subject-matter defined in the following claims.

REFERENCES

US 2008/0137891 A1 (Vohringer) 12 Jun. 2008
U.S. Pat. No. 6,208,741 (INSONUS MEDICAL) 27 Mar. 2001
WO 00/25551 A1 (BELTONE ELECTRONICS) 4 May 2000
U.S. Pat. No. 6,751,327 (INSONUS MEDICAL) 15 Jun. 2004

The invention claimed is:

1. A hearing aid having a housing part configured to be positioned in the ear canal of a user, the hearing aid comprising:
   a microphone arranged in the housing;
   a battery arranged in the housing;
   a receiver arranged in the housing; and
   a folded substrate carrying components of the hearing aid, wherein said folded substrate is folded from a planar substrate along a folding line, said folded substrate being folded 180° along the folding line and comprising a first part and a second part separated by the folding line,
   wherein said planar substrate has a critical folding radius in a folding zone around said folding line, which is smaller than a critical folding radius of other portions of the planar substrate outside said folding zone,
   a thickness of said planar substrate in said folding zone is smaller than in said other portions, thereby causing the critical folding radius of said folding zone to be smaller than the critical folding radius of said other portions, said thickness being the dimension perpendicular to the planar surfaces of said planar substrate in an unfolded state, and
   each component carried by said folded substrate is mounted on a substrate surface outside of said folding zone.

2. The hearing aid according to claim 1, wherein said folding zone comprises curved parts of the first and second substrate parts.

3. The hearing aid according to claim 1, wherein said planar substrate is folded along said folding line to provide that the folding radius is larger than or equal to a critical folding radius for said folding zone of said planar substrate.

4. The hearing aid according to claim 1, wherein the folded substrate comprises first and second folded parts, the respective parts of the folded substrate being separated by the folding line, and wherein the outline of the folded substrate when viewed in a top view perpendicular to one of the folded parts has a non-rectangular form.

5. The hearing aid according to claim 1, wherein said planar substrate is a multi-layer substrate adapted for having more than one layer of electric conductors to provide electrical connection to components on the substrate and/or to components external to the substrate.

6. The hearing aid according to claim 1, wherein said planar substrate is adapted to allow the mounting of components on both sides, outside of said folding zone.

7. The hearing aid according to claim 6, wherein each part is equipped with electronic components mounted on both sides of the respective planar substrate parts.

8. The hearing aid according to claim 1, wherein the folded substrate comprises one or more extensions adapted for electrically connecting components on the folded substrate to components external to the folded substrate, wherein an extension extends from an edge of one of the parts of the folded substrate other than the folded edge.

9. The hearing aid according to claim 8, wherein one or more of said extensions of the folded substrate are adapted to press against a housing of an external component, when the substrate is in a folded state.

10. A portable electronic device according to claim 9, wherein the one or more extensions comprise soldering pads or electrically conducting tape, which are prepared for soldering or otherwise fixing the extensions of the folded substrate to the external component.

11. The hearing aid according to claim 1, wherein the folded substrate comprises one or more distance keeping components adapted for ensuring a minimum distance between opposing surfaces of the folded substrate.

12. The hearing aid according to claim 11, wherein a distance keeping component comprises a locking mechanism for locking two ends of a finalized folded substrate.

13. The hearing aid according to claim 1, wherein the housing is configured as a deep in the ear canal type hearing instrument, and/or configured for being mounted fully or partially in the bony part of the ear canal.

* * * * *